(12) United States Patent
Montcalm et al.

(10) Patent No.: US 6,309,705 B1
(45) Date of Patent: Oct. 30, 2001

(54) PROCESS FOR FABRICATING HIGH REFLECTANCE-LOW STRESS MO—SI MULTILAYER REFLECTIVE COATINGS

(75) Inventors: Claude Montcalm, Livermore; Paul B. Mirkarimi, Sunol, both of CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/483,274

(22) Filed: Jan. 13, 2000

Related U.S. Application Data

(62) Division of application No. 09/027,308, filed on Feb. 20, 1998, now Pat. No. 6,110,607.

(51) Int. Cl.[7] .............................. B05D 3/02; B05D 1/36; B05D 5/06
(52) U.S. Cl. ................ 427/376.2; 427/162; 427/397.7; 427/376.7; 427/383.1; 427/404; 427/419.1
(58) Field of Search ................ 427/162, 397.7, 427/376.2, 376.7, 383.1, 404, 419.1

(56) References Cited

U.S. PATENT DOCUMENTS

| | | | |
|---|---|---|---|
| 5,500,312 | * 3/1996 | Harriott et al. | 430/5 |
| 5,911,858 | * 6/1998 | Ruffner | 204/192.27 |
| 6,011,646 | * 1/2000 | Mirkarimi et al. | 359/359 |

* cited by examiner

Primary Examiner—Shrive Beck
Assistant Examiner—Michael Barr
(74) Attorney, Agent, or Firm—L. E. Carnahan; Alan H. Thompson

(57) ABSTRACT

A high reflectance-low stress Mo—Si multilayer reflective coating particularly useful for the extreme ultraviolet (EUV) wavelength region. While the multilayer reflective coating has particular application for EUV lithography, it has numerous other applications where high reflectance and low stress multilayer coatings are utilized. Multilayer coatings having high near-normal incidence reflectance ($R \geq 65\%$) and low residual stress ($\leq 100$ MPa) have been produced using thermal and non-thermal approaches. The thermal approach involves heating the multilayer coating to a given temperature for a given time after deposition in order to induce structural changes in the multilayer coating that will have an overall "relaxation" effect without reducing the reflectance significantly.

14 Claims, 2 Drawing Sheets

PROCESS FOR FABRICATING HIGH REFLECTANCE-LOW STRESS MO— SI MULTILAYER REFLECTIVE COATINGS

RELATED APPLICATION

This application is a division of application Ser. No. 09/027,308, filed Feb. 20, 1998, now U.S. Pat. No. 6,110,607 issued Aug. 29, 2000.

The U.S. Government has rights in this invention pursuant to Contract No. W-7405-ENG-48 between the U.S. Department of Energy and the University of California for the operation of Lawrence Livermore National laboratory.

BACKGROUND OF THE INVENTION

The present invention relates to multilayer coatings, particularly to Mo—Si multilayer reflective coatings, and more particularly to Mo—Si multilayer coatings having a near normal incidence reflectance of $\geq 65\%$ in the extreme ultraviolet wavelength region and a magnitude of residual stress of not greater than about 100 MPa and to the method for fabricating same.

Multilayer structures composed of alternating thin layers of materials with vastly different optical properties have proven effective as high-reflectance coatings for various applications. The Mo—Si system which gives a high reflectance (~60%) for certain wavelengths, such as in the 13.0–13.5 wavelength region, is of particular technological importance due to its application to high-resolution, multiple-reflection imaging systems now being developed for projection lithography.

Extreme-ultraviolet (EUV) lithography systems require several high precision optics coated with reflective multilayers. To obtain sufficient throughput and image quality, these multilayer coatings must simultaneously have high reflectance ($R \geq 65\%$) and low magnitude of residual stress (less than 100 MPa) The multilayer coatings generally consist of alternating layers of molybdenum (Mo) and silicon (Si).

There is a strong commercial driving force for increased miniaturization in electronic devices and, hence, an EUV lithography tool has significant commercial potential. The performance of an EUV lithography tool is key to its implementation over other competing technologies, and high film stresses and low EUV reflectances degrade the performance of a EUV lithography tool.

Over the past decade or so numerous publications described the dependency of EUV reflectance of Mo—Si multilayer mirrors or optics on their fabrication parameters. However, the number of publications addressing the problem of stress in Mo—Si multilayers designed for high reflectance in the EUV wavelength is relatively small. The later publications describe how the stress of Mo—Si multilayer coatings can be reduced to low levels (<100 MPa) by: 1) post-deposition annealing (see Kola et al, Appl. Phys. Lett. 60,3120 (1992) and Kassner et al, J. Mat. Sci. 31, 2291 (1996); 2) variation of the Mo to Si layer thickness or ratio (see Nguyen et al, in Physics of X-Ray Multilayer Structures, Optical Society of America, Washington, D.C., 1994, Vol. 6, P. 103; Windt et al, J. Appl. Phys. 78,2423 (1995); and Tinone et al, J. Electron Specrosc. Relat. Phenom. 80,461 (1996); and 3) adjustment of the sputter deposition process such as base pressure or target power (see Windt et al and Tinone et al above). Although Kola et al and Windt et al discuss low stress coatings, none of these prior efforts involve the fabrication of a high reflectance ($\geq 65\%$) Mo—Si multilayer coating with a low magnitude of stress (<100 MPa), and no EUV reflection data was shown, except in Kola et al where reflectances around 58% were measured, which is significantly lower than 65%, which is necessary for use in EUV lithography.

Recently, Mo—Si multilayer coatings using a buffer layer between the substrate and the Mo—Si coatings have provided high reflectance and low stress. This non-thermal or a thermal method of producing the high reflectance-low stress Mo—Si multilayer coatings is described and claimed in copending U.S. application Ser. No. 09/027,309, filed Feb. 20, 1998, now U.S. Pat. No. 6,011,646, entitled "A Method To Adjust Multilayer Film Stress Induced Deformation Of Optics", assigned to the same assignee.

The present invention provides a thermal approach to producing Mo—Si multilayer reflective coatings with high reflectance and low stress, which are particularly applicable for use in an EUV lithography tool. The present invention provides a high reflectance-low stress Mo—Si multilayer coating produced by heating the multilayer coating to a given temperature during a given time period after deposition to induce structural changes in the multilayer coating. Mo—Si multilayer coatings of this invention produced using this method have a high reflectance ($R \geq 65\%$) and a low magnitude of residual stress ($\leq 100$ MPG). It has been verified by experimentation that using the thermal method, low stresses are obtained in Mo—Si multilayer coatings with minimal (~1%–3%) loss in reflectance.

SUMMARY OF THE INVENTION

It is an object of the present invention to provide a high reflectance-low stress Mo—Si multilayer reflective coating.

A further object of the invention is to reduce multilayer stress by at least 75% while maintaining reflectance of at least 65%.

A further object of the invention is to provide Mo—Si multilayer coatings for use in extreme-ultraviolet (EUV) lithography systems.

A further object of the invention is to utilize slow or rapid post-deposition annealing to reduce stress in multilayers.

A further object of the invention is to enable the production of reflective coatings for EUN lithography tools having both high (>65%) reflectance and low (<100 MPa) magnitude of residual stress.

Another object of the invention is to provide a method for substantially reducing the stress in Mo—Si multilayer coatings.

Another object of the invention is to provide Mo—Si multilayers using a method which results in reducing stress in the Mo—Si multilayers with minimal loss of reflectance thereof.

Another object of the invention is to provide Mo—Si multilayer films by thermal processing of the deposited Mo—Si multilayers thereby reducing the stress of the multilayers with minimal (~1%–3%) reflectance loss.

Another object of the invention is to produce high reflectance-low stress Mo—Si multilayer coatings for EUV lithography tools by a method that involves heating the multilayer coatings to a given temperature during a given time after deposition which reduces the magnitude of stress with minimal loss in reflectance of the multilayer coating.

Other objects and advantages of the present invention will become apparent from the following description and accompanying drawing. The invention provides high reflectance-low stress Mo—Si multilayer reflective coatings for EUV lithography.

The Mo—Si multilayer reflective coatings of the present invention may be produced by a method which involves thermally processing the Mo—Si multilayer coatings after deposition for reducing the residual stress therein. The thermal processing, for example, is carried out by either slow or rapid annealing by heating the deposited Mo—Si multi-layers to a given temperature (e.g. 220° C. or 300° C.) for a given time period (e.g. 6 hrs. or 30 secs.) which reduces the magnitude of stress to less than 100 MPG, with a 1%–3% reflectance loss, whereby the reflectance of the multilayers remains above 65% thus enabling use thereof in EUV lithography. The stress can be reduced by at least 75%. While the Mo—Si multilayer reflective coatings of the present invention are particularly applicable for EUV lithography, the reflective coatings may also be used for x-ray laser cavities and optics, optics for sources including laser-produced plasmas and synchrotrons, and in optics for x-ray microscopy and astronomy.

BRIEF DESCRIPTION OF THE DRAWING

The accompanying drawings, which are incorporated into and form a part of the disclosure, illustrate an embodiment of the invention and, together with the description, serve to explain the principles of the invention.

DETAILED DESCRIPTION OF THE INVENTION

The present invention is directed to a Mo—Si high reflectance-low stress multilayer reflective coating and method of fabricating. The Mo—Si multilayer coating has a near normal incidence reflectance of $\geq 65\%$ in the 13.0–13.5 nm wavelength region and a magnitude of the residual stress of less than 100 MPa, and thus is particularly adapted for use in extreme ultraviolet (EUV) lithography.

Typical EUV lithography systems will make use of up to seven high precision optics coated with reflective multilayers. To maximize the throughput of these systems, it is therefore critical that the multilayer coatings have the highest possible normal incidence reflectance. These multilayer coatings generally consist of alternating layers of molybdenum (Mo) and silicon (Si). The Mo—Si multilayers optimized for maximum near normal incidence reflectance at wavelengths around 13.4 nm typically have a stress of –350 to –450 MPa (compressive). These levels of stress are high enough to deform the figure of the precision optics used in an EUV projection camera, which significantly affects the image quality that can be achieved with the EUV system. It is therefore crucial that the multilayer coating deposited on the precision optics have a high reflectance ($R \geq 65\%$) and a low magnitude of stress (<100 MPa).

The present invention provides for the fabrication of multilayer coatings that meets both requirements, i.e., their EUV reflectance and stress, and experimental measurement tests on these Mo—Si multilayer coatings showed over 65% reflectance and less than 100 MPa stress. During the research and experimental testing of Mo—Si multilayer coatings, several approaches having different advantages and disadvantages have been utilized The obtaining of high reflectance-low stress Mo—Si multilayer coatings of a quality useable in EUV lithography has been accomplished by both non-thermal and thermal approaches. The non-thermal approach is described and claimed in above-referenced copending application Ser. No. 09/027,309.

The thermal approach of the present invention comprises heating the Mo—Si multilayer coating to a given temperature for a given time after deposition. It was found that heating during deposition did not produce satisfactory results. The post-deposition heating induces structural changes in the multilayer that have the effect of reducing the overall stress of the multilayer. The key issue is to determine the exact heating recipe that will result in the maximum stress reduction without significant loss of reflectivity.

Figure 1:
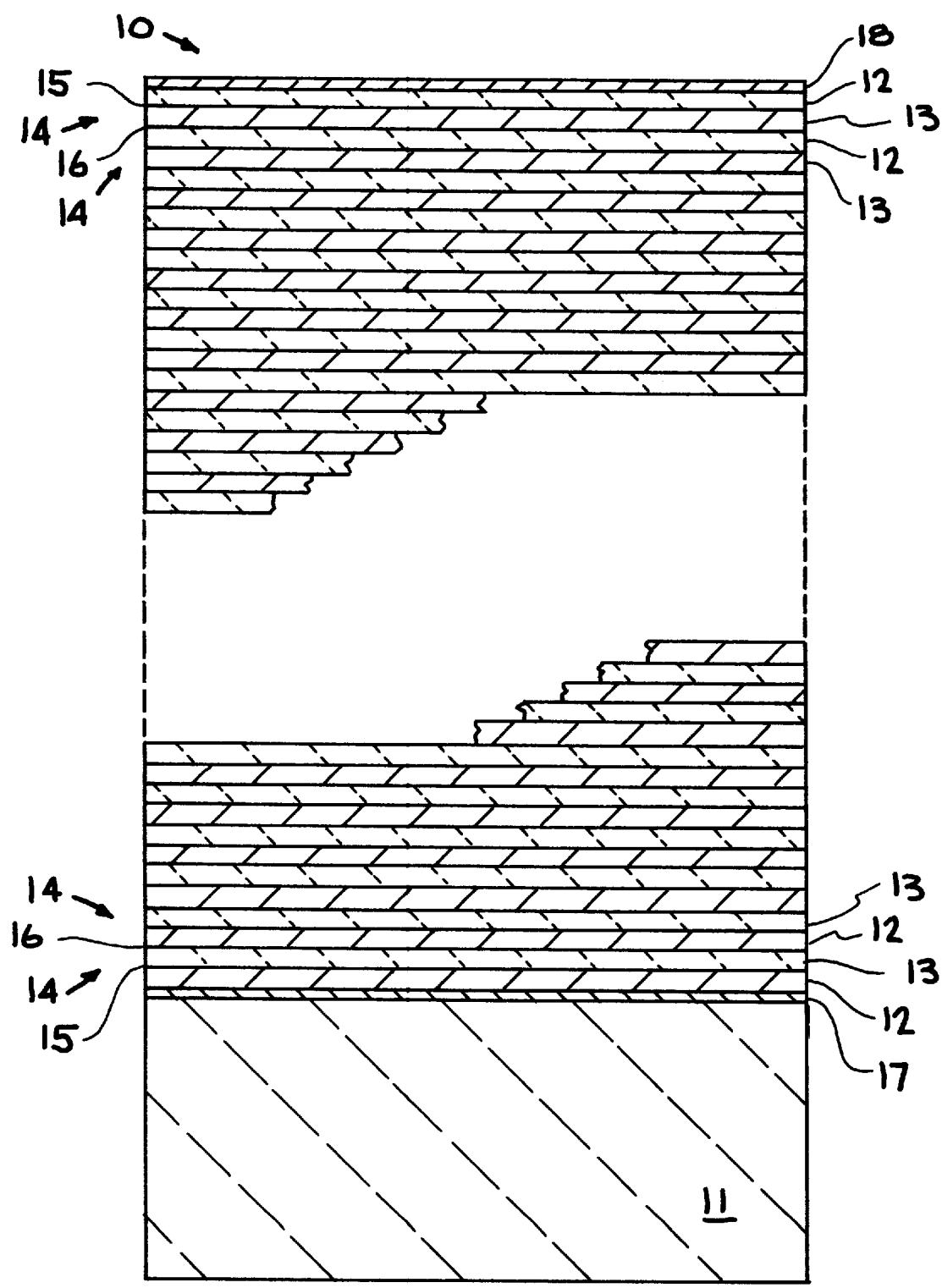
FIG. 1 is a partial cross-sectional view of an embodiment of an Mo—Si multilayer reflective coating deposited on a substrate.

FIG. 1 illustrates in cross-section a molybdeum-silicon (Mo—Si) multilayer coating deposited on a substrate. As shown, the Mo—Si multilayer coating generally indicated at 10 comprises a substrate 11, composed, for example, of silicon, ultra-low thermal expansion of glass or glass-ceramics (such as zerodur or ULE), quartz, or float glass, and sapphire, on which is deposited alternating layers 12 of Si and layers 13 of Mo, with a topmost layer 12 of Si. Each pair of layers indicated at 14 (one layer Si and one layer Mo) has an interface 15, while each adjacent layer pairs 14 have an interface 16. A buffer barrier or adhesion layer 17 may, where needed, be deposited between the substrate and the multilayer, and a capping layer 18 may be deposited on the outer most layer of the multilayer. While it is preferred to have the innermost and outermost layers be of Si, these layers may be of Mo, but tests indicate that reflectivity may be reduced.

For a typical Mo—Si multilayer coating having a near normal incidence reflectance of 67.1% at a wavelength of 13.3 nm and a stress of –407 MPa (compressive), a thermal cycle of 220° C. for six (6) hours reduced the stress to –63 MPa with a reflectance loss of only 1.5% (final reflectance of 65.6%). In this experiment, the Mo—Si multilayer coating contained 40 layer pairs of Mo and Si, with each of the layer pairs having a thickness of 6.8 nm and a Mo fraction (Mo to Si layer thickness ratio) of 0.4.

The thermal (heating) approach (recipe) utilized to produce the multilayer coatings of the present invention will depend on several factors, including the number of layer pairs, the thickness of the layer pairs, and the fraction of Mo utilized compared to Si (Mo to Si ratio). For example, the final stress of a Mo—Si layer pair having a Mo fraction of 0.4 will be different from that of a layer pair having a Mo fraction of 0.8.

The thermal approach may be incompatible with certain substrates because heating may deform the figure of the substrate. However, annealing may stabilize the multilayer. The present thermal approach, like the above-referenced non-thermal approach, enables a choice by which stress in the multilayer coatings can be significantly reduced with only minimal reduction in reflectance. The choice of approach (thermal or non-thermal) therefore depends on several factors, and various other approaches with a different set of advantages may be developed.

The thermal approach used to produce the multilayer coatings of this invention can be utilized to process previously formed Mo—Si multilayer coatings or as the final processing operation immediately after the deposition of the Mo—Si multilayer.

Figure 2:
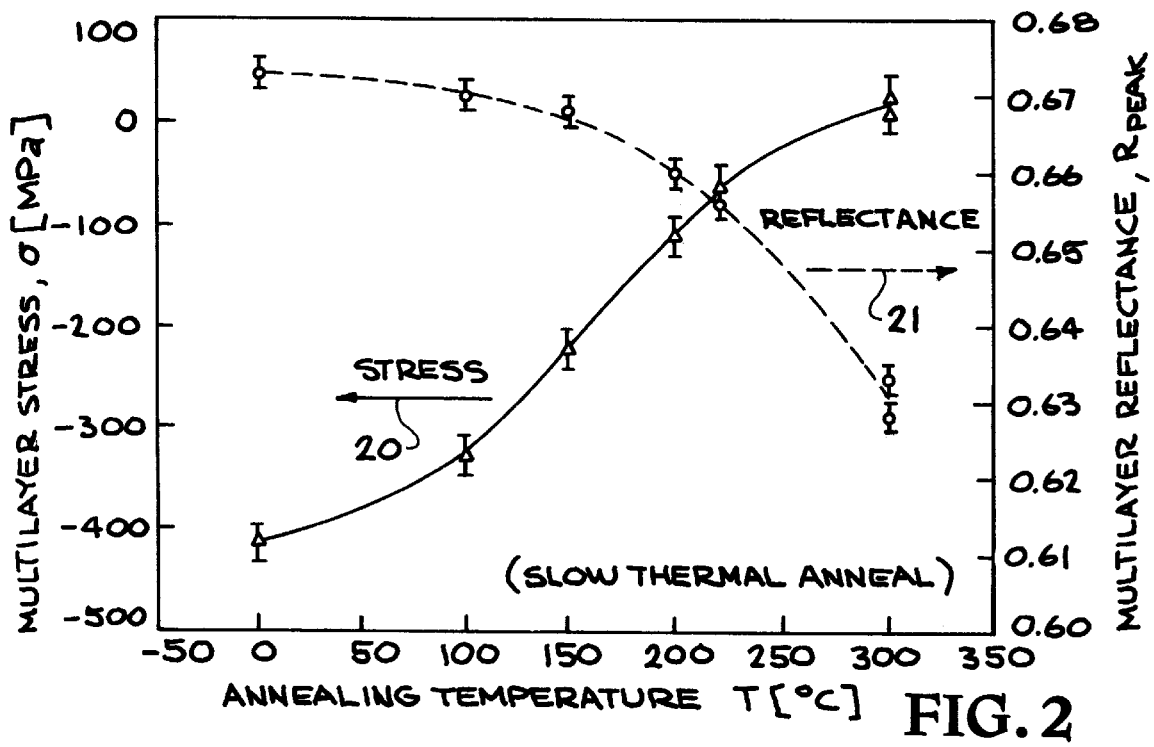
FIG. 2 graphically shows the effect of annealing temperature on the stress and reflectance of a Mo—Si multilayer.

FIG. 2 shows the effect of annealing temperature on the stress, indicated by arrow 20, and the reflectance, indicated by arrow 21, of 10 Mo—Si multilayers. The slow thermal anneal indicated in FIG. 2 is carried out at temperatures of 100°, 150°, 200°, 220°, and 300° C., for example, with respective time periods of 12, 9, 6, 6 and 3 hours.

Figure 3:
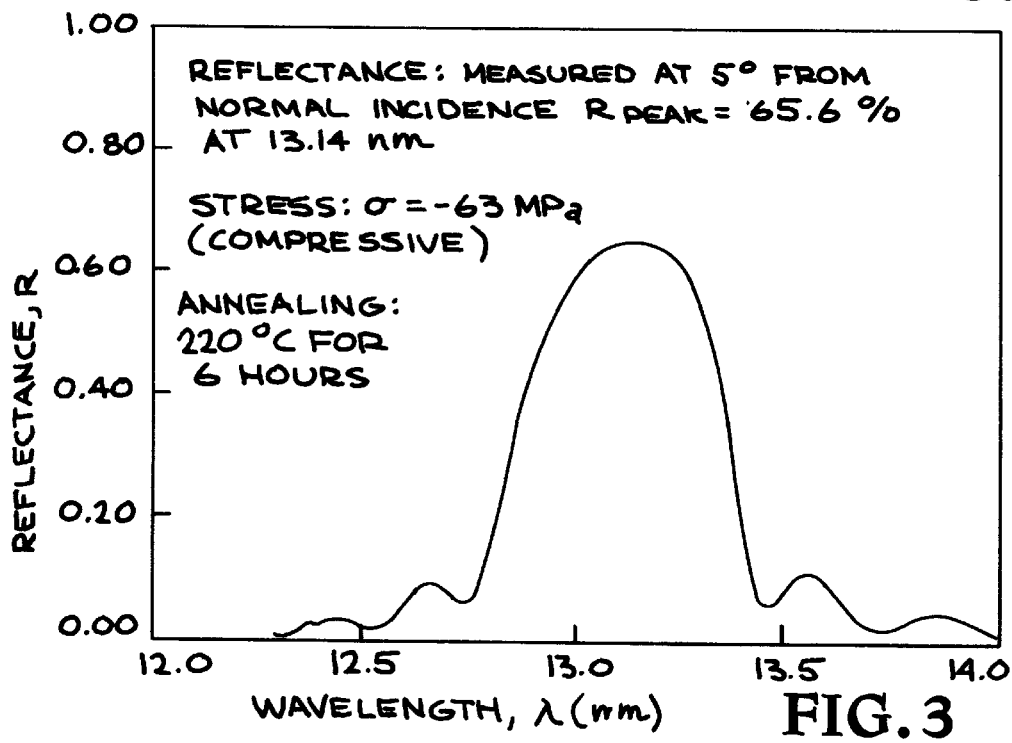
FIG. 3 graphically shows reflectance vs. wavelength for high reflectance multilayers of the present invention.

FIG. 3 shows the reflectivity vs. wavelength for high reflectance Mo—Si multilayer. In the tests on which FIG. 3 was based, utilizing a wavelength in the range of 12.3–14.0 nm and with the annealing at 220° C. for 6 hours, there was a reflectance peak (R peak) equal to 65.6% at 13.14 nm, measured at 5° from normal incidence, with a stress ($\sigma$) equal to −63 MPa (compressive).

The Mo—Si multilayer reflective coatings have been produced using slow and rapid post-deposition thermal annealing treatments. The slow thermal anneals were performed by heating and cooling the multilayers at a rate of 5° C./min. in an ambient air or $N_2$ atmosphere. The rapid thermal anneals were performed by raising the temperature from room temperature to 300° C. in 30 sec., maintaining the temperature constant at 300° C. for another 30 sec., and then cooling down to room temperature with a target ramp time of 30 seconds. Tests showed that the cool down generally did not follow the linear drop targeted because no active cooling was used. The higher the anneal temperatures, which may vary from about 200° C. to about 400° C., the longer the cool down step. The rapid thermal anneal treatment utilizes temperatures of 200–400° C., which are about 100° C. higher than those used in the slow thermal anneal treatment. Rapid thermal annealing has been carried out using a 400° C. temperature for 3 minutes.

The number of alternating layer pairs, the Mo to Si ratio, and the thickness of the alternating layers of Mo and Si which defines a layer pair are dependant on the wavelength range of the application. For example, for a wavelength of 13.0–14.0 nm, the bi-layer thickness is 65–70 angstroms, the thickness ratio is 0.35–0.45, and the number of layers is 40–60, but for a wavelength of 23.2–23.6 nm, the bi-layer thickness is about 124 angstroms, the thickness ratio is about 0.20 and the number of layers is 40–60.

It has thus been shown that the present invention provides high reflectance-low stress Mo—Si multilayer reflective coatings for EUV lithography. This is accomplished by heating the multilayer coating to a given temperature during a given time after deposition in order to induce structural changes in the multilayer coating that will have an overall "relaxation" effect without reducing the reflectance significantly. While the multilayer coating of the invention may be utilized in the fabrication of the optics, for example, in EUV lithography tools it can also be used in applications in x-ray laser research, x-ray spectroscopy, x-ray microscopy, x-ray astronomy, and synchrotron optics. In addition, facilities, such as the National Ignition Facility, which requires high reflectance-low stress optical coatings for soft x-ray and EUV wavelengths, may effectively utilize the Mo—Si multilayers.

While particular embodiments, operation procedures, materials, parameters, etc. have been set forth to exemplify and teach the principles of the invention, such are not intended to be limiting. Modifications and changes may become apparent to those skilled in the art, and it is intended that the invention be limited only by the scope of the appended claims.

What is claimed is:

1. In a process for producing Mo—Si multilayer reflective coatings having a reflectance of at least 65% in the extreme ultraviolet wavelength region and a magnitude of residual stress of no greater than 100 MPa, the improvement including:

after deposition of the multilayer reflective coating, heating the coating to a temperature in the range of about 100° C. to about 400° C. during a time in the range of about 30 seconds to about 12 hours time.

2. The improvement of claim 1, wherein the temperature and the time is determined by the characteristics of the multilayer reflective coating, these characteristics being selected from the group consisting of Mo to Si ratio, thickness of each layer or layer pair, and number of layer pairs in the coating.

3. The improvement of claim 1, wherein heating after deposition caused the residual stress to be reduced by at least 75%, with at least a reflectivity of 65%.

4. The improvement of claim 3, wherein the heating is carried out by slow annealing wherein the temperature is 100–300° C. and the time is 12 hours to 3 hours.

5. The improvement of claim 3, wherein the heating is carried out by rapid annealing wherein the temperature is about 200–400° C. and the time is on the order of about 30 seconds to 3 minutes.

6. The improvement of claim 1, wherein heating of the Mo—Si multilayer reflective coating to a temperature of 220° C. for six hours produced a magnitude of residual stress reduction of greater than 75% with only a reflectance reduction of less than 1.5%.

7. A method for significantly reducing the magnitude of residual stress in Mo—Si multilayer coatings to less than 100 MPa while maintaining least a 65% reflectance of the multilayer coatings in the extreme ultraviolet wavelength region, comprising:

providing a Mo—Si multilayer coating;

heating the multilayer coating to a temperature in the range of 100° C. to 400°; and maintaining the heated temperature for a time period of 30 seconds to about 12 hours.

8. The method of claim 7, additionally including forming the Mo—Si multilayer coating.

9. The method of claim 7, wherein the multilayer coating is formed on a substrate selected from the group consisting of silicon, sapphire, glass ceramics, quartz, float glass, and glass having substantially no thermal expansion.

10. The method of claim 7, wherein heating the multilayer coating is carried out at about 220° C. for a time period of about 6 hours.

11. The method of claim 7, wherein residual stress was reduced by 75% with a reduction of less than about 1.5% in reflectance.

12. The method of claim 7, wherein heating the multilayer coating is carried out at about 300° C. for a time period of about 30 seconds.

13. The method of claim 7, additionally including providing a layer of material intermediate the multilayer coating and a substrate.

14. The method of claim 7, additionally including providing a capping layer on the multilayer coating.

* * * * *